US 11,783,885 B2
Oct. 10, 2023

(12) United States Patent
Kim et al.

(54) INTERACTIVE MEMORY SELF-REFRESH CONTROL

(71) Applicant: Micron Technology, Inc., Boise, ID (US)

(72) Inventors: Kang-Yong Kim, Boise, ID (US); Hyun Yoo Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/513,090

(22) Filed: Oct. 28, 2021

(65) Prior Publication Data

US 2022/0139448 A1 May 5, 2022

Related U.S. Application Data

(60) Provisional application No. 63/108,188, filed on Oct. 30, 2020.

(51) Int. Cl.
*G11C 11/406* (2006.01)
*G11C 7/10* (2006.01)

(52) U.S. Cl.
CPC ...... *G11C 11/40615* (2013.01); *G11C 7/1009* (2013.01); *G11C 11/40618* (2013.01); *G11C 11/40622* (2013.01)

(58) Field of Classification Search
CPC ........... G11C 11/40615; G11C 7/1009; G11C 11/40618; G11C 11/40622; G11C 7/1063
USPC ....................................................... 365/222
See application file for complete search history.

(56) References Cited

U.S. PATENT DOCUMENTS

| 11,195,568 | B1* | 12/2021 | Atishay ............... G11C 29/42 |
| 2007/0277065 | A1 | 11/2007 | Sato |
| 2013/0279283 | A1 | 10/2013 | Seo et al. |
| 2014/0016423 | A1 | 1/2014 | Ware et al. |
| 2014/0043888 | A1 | 2/2014 | Chen et al. |
| 2015/0378817 | A1 | 12/2015 | Tsern et al. |

(Continued)

FOREIGN PATENT DOCUMENTS

WO    2022047159    3/2022

OTHER PUBLICATIONS

"International Search Report and Written Opinion", Application No. PCT/US2021/057341, dated Feb. 21, 2022, 10 pages.

(Continued)

*Primary Examiner* — Fernando Hidalgo
(74) *Attorney, Agent, or Firm* — Colby Nipper PLLC

(57) ABSTRACT

Systems, apparatuses, and methods related to a memory device, such as a low-power dynamic random-access memory (DRAM), and an associated host device are described. The memory device includes control circuitry that can determine an operational status of the memory device (e.g., whether the memory device is currently performing a self-refresh operation). The control circuitry can also transmit a signal indicative of the operational status to the host device in response to receiving a command directing the memory device to exit a self-refresh mode. The host device can operate based on the signal. The signal may therefore allow the memory device, the host device, or both to manage operations, including whether to send, receive, or process commands and data read/write requests during times that may be associated with self-refresh operations.

36 Claims, 8 Drawing Sheets

(56) References Cited

U.S. PATENT DOCUMENTS

| | | | |
|---|---|---|---|
| 2016/0163377 A1* | 6/2016 | Oh | G11C 11/40615 365/222 |
| 2017/0062038 A1 | 3/2017 | Doo et al. | |
| 2017/0069371 A1 | 3/2017 | Shin et al. | |
| 2017/0075603 A1 | 3/2017 | Trantham | |
| 2017/0140810 A1 | 5/2017 | Choi et al. | |
| 2017/0278562 A1 | 9/2017 | Nale | |
| 2018/0096719 A1 | 4/2018 | Tomishima et al. | |
| 2019/0139597 A1* | 5/2019 | Nakaoka | G11C 11/40615 |
| 2019/0341099 A1* | 11/2019 | Kim | G11C 11/40615 |
| 2019/0371391 A1* | 12/2019 | Cha | G06F 11/1016 |
| 2020/0201718 A1* | 6/2020 | Richter | G06F 11/1469 |
| 2020/0258566 A1 | 8/2020 | Schaefer et al. | |
| 2021/0335416 A1* | 10/2021 | Joo | G11C 11/4085 |
| 2022/0050748 A1* | 2/2022 | Kim | G11C 11/4087 |
| 2022/0066700 A1 | 3/2022 | Kim et al. | |

OTHER PUBLICATIONS

"International Search Report and Written Opinion", Application No. PCT/US2021/047956, dated Dec. 16, 2021, 12 pages.
"International Preliminary Report on Patentability", Application No. PCT/US2021/047956, dated Feb. 28, 2023, 8 pages.
"International Preliminary Report on Patentability", Application No. PCT/US2021/057341, dated May 2, 2023, 7 pages.
"Non-Final Office Action", U.S. Appl. No. 17/458,068, dated Apr. 27, 2023, 15 pages.

* cited by examiner

INTERACTIVE MEMORY SELF-REFRESH CONTROL

RELATED APPLICATION

This application claims priority under 35 U.S.C. § 119(e) to U.S. Provisional Patent Application 63/108,188, filed on Oct. 30, 2020 which is incorporated herein by reference in its entirety.

BACKGROUND

Low-power double data rate (DDR) memory, sometimes referred to as LPDDR or mobile DDR memory, is a DDR synchronous dynamic random-access memory (DDR SDRAM) that can use less power than some other types of DDR SDRAM. In some applications, LPDDR memory may also operate at higher data rates than other types of DDR SDRAM while using less power. LPDDR memory is therefore often used in mobile devices, such as cellular phones and tablet computers, to extend battery life. Increasingly, LPDDR memory is also being used in server applications to reduce electricity usage, thereby lowering operational costs in an environmentally sustainable manner. Designing LPDDR memory for different use cases and applications, however, is challenging, because the demand for lower latency and reduced power consumption continues to increase.

BRIEF DESCRIPTION OF THE DRAWINGS

The details of one or more aspects of interactive memory self-refresh control are described in this document with reference to the following drawings. The same numbers are used throughout the drawings to reference like features and components:

FIGS. 5-1 and 5-2 depict example timing diagrams illustrating the operation of a host device and a memory device in accordance with example implementations of the interactive memory self-refresh control techniques and apparatuses.

DETAILED DESCRIPTION

Overview

Figure 1:
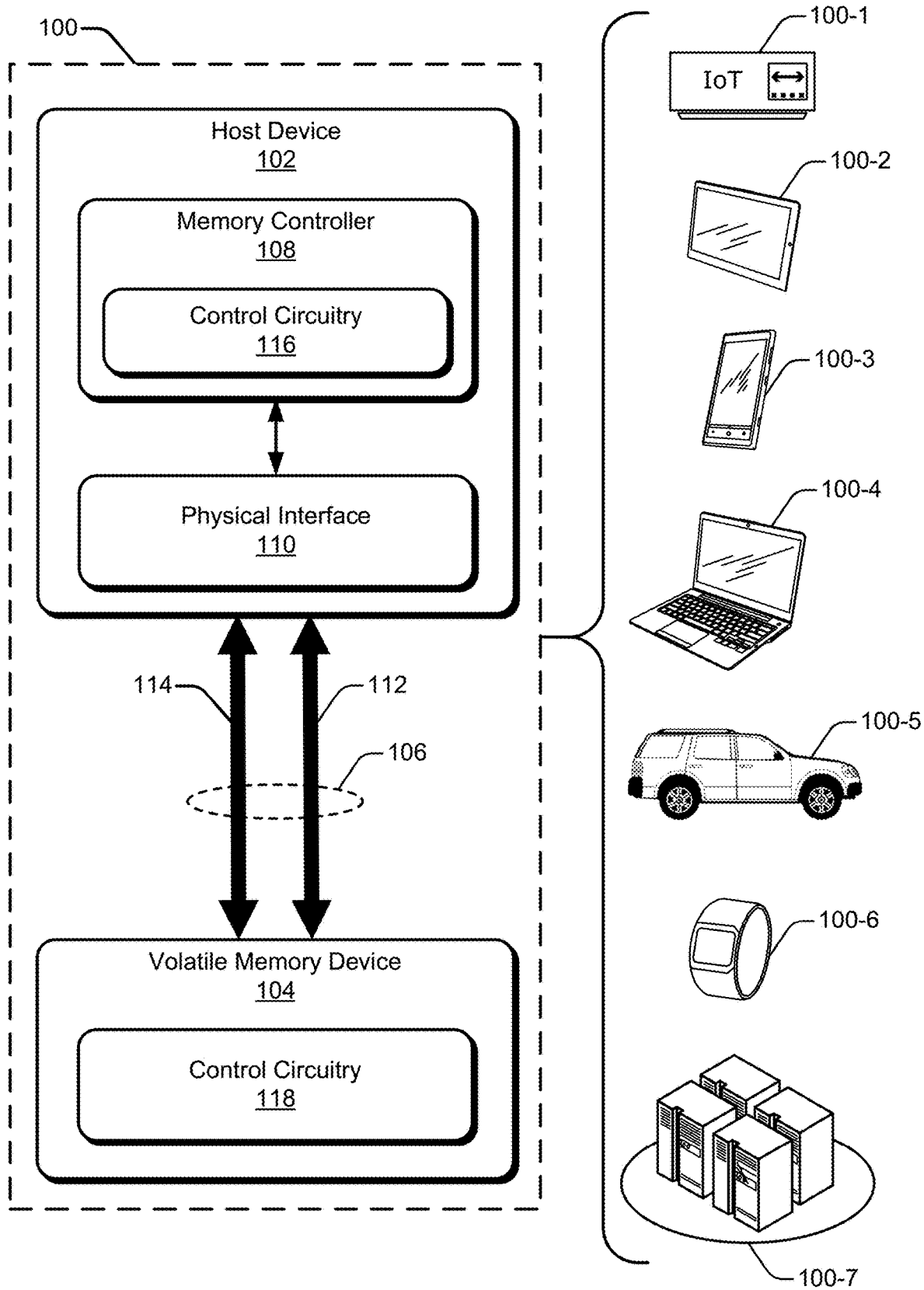
FIG. 1 illustrates an example apparatus that can implement aspects of interactive memory self-refresh control.

For some applications, such as portable electronic devices that operate on battery power and data centers that employ thousands of memory devices, reducing power usage even further for next-generation low-power memory can provide appreciable improvements in efficiency. These applications may also benefit from increasing memory performance by reducing memory-access latency or periods of memory unavailability. Some implementations that are described in this document can provide one or both advantages for memory, including low-power memory types.

Double data rate synchronous dynamic random-access memory (DDR SDRAM), including low-power DDR (LPDDR) SDRAM, is a volatile memory, which means that the stored information is lost if power is not maintained. Because the memory cells of volatile memory are made in part from capacitors, the charge slowly drains from the memory cells and the data can be lost if the capacitor is not recharged. Therefore, to maintain an appropriate charge to represent a binary "0" or "1," the memory cells must be periodically refreshed. To perform a refresh operation, the memory reads data from a memory cell corresponding to a refresh address into a temporary storage (e.g., a sense amp) and writes the data back to the memory cell with the proper charge. A refresh address can include memory cell addresses, row addresses, bank addresses, and the like. Refresh operations may be initiated and controlled by a memory controller located outside of the memory (e.g., using an auto-refresh command) or by a controller or timer located internal to the memory (e.g., using a self-refresh operation).

Generally, when the memory device is performing or undergoing an auto-refresh or self-refresh operation, the memory controller cannot send data read or write requests to the memory being refreshed. Thus, while a host device (e.g., applications and/or processors) can send the memory controller requests to read or write data, the memory controller may not be able to fulfill them while the memory is refreshing. This can affect performance because read and write requests can accumulate in the memory-controller queue while the memory device is inaccessible. Depending on the queue depth or size, when the queue is full, the memory controller may ignore some requests. Because the memory controller controls some refresh operations (e.g., auto-refresh) and manages the data read and write requests (along with other operations related to read and write), the memory controller can time data requests relative to those refresh operations. During the self-refresh periods, however, the memory controller and other host device components (e.g., communication or other interfaces) may be idle, so the memory device manages the refresh intervals for self-refresh operations using an internal self-refresh timer. Because the memory device may be performing or undergoing a self-refresh operation when the memory controller issues a command to end a self-refresh operation or exit a self-refresh mode (e.g., a self-refresh exit command), the memory controller may be "required" to wait for another interval after issuing the command to allow the memory device to complete any in-process self-refresh operations (e.g., as "required" under an operating architecture standard, such as LPDDR4 or LPDDR5).

While this feature can help to ensure that necessary self-refresh operations are completed, the "required" wait time may be longer than is actually necessary to maintain data integrity because the memory controller does not have access to the memory's self-refresh status (e.g., whether the memory device is performing a self-refresh operation). This longer waiting can increase latency and thus decrease memory performance. For example, while the length of this interval may vary, it must be long enough to accommodate the minimum time a refresh cycle takes (e.g., approximately 200 to 500 nanoseconds, depending on memory density), along with a smaller amount of time to account for latencies and other delays (e.g., approximately four to ten additional nanoseconds). Further, while the time between memorycontroller-induced refresh operations for the same cell may be relatively short (e.g., approximately 32 milliseconds or approximately 64 milliseconds), when the memory device is in a power-saving mode (e.g., self-refresh mode), the memory device may increase the interval between operations (e.g., to between approximately 200 milliseconds (ms) and approximately 500 ms). This can further extend the waiting time. In either case, during higher-speed operation, there may be increased operating temperatures, which can require more-frequent refresh operations to maintain data integrity. Thus, considering the length of the refresh cycle and typical times between self-refresh operations, there may be frequent situations in which the memory controller is waiting for the memory device to be considered available when the memory device is actually not performing a self-refresh operation.

In contrast, consider the following discussion of techniques for taking advantage of the benefits of interactive memory self-refresh control, which may be implemented as part of a volatile-memory architecture, including an LPDDR architecture, such as a post-LPDDR5 architecture. In the described techniques, the memory device can share an internal operational status (also referred to as an operational status or a self-refresh operational status) with the memory controller (e.g., inform the memory controller whether the memory device is performing a self-refresh operation).

Consider an example implementation of the described techniques for interactive memory self-refresh control in which an LPDDR memory includes control circuitry that can determine the self-refresh operational status of the memory device. In response to a command from the memory controller, the control circuitry can transmit a signal to the memory controller that indicates the self-refresh operational status. For example, in response to a self-refresh exit (SRX) command, the memory device can output a signal to the memory controller that indicates whether the memory device is currently performing an internal self-refresh operation (also referred to as a self-refresh operation). If no self-refresh operation is being performed, the memory controller can begin sending memory requests, like data read and write requests. If a self-refresh operation is being performed, the memory controller can wait until the signal indicates the self-refresh operation is complete and then begin sending data read and write requests. The memory device can output the signal to the host device using, for example, an output data bus (e.g., one or more output DQ pins, a data mask inversion (DMI) pin, or a dedicated pin). Sharing the status of the self-refresh operation with the host device can improve system performance, including data rate and latency, by reducing the amount of time that read and write requests are paused while self-refresh operations are performed as a memory device exits a self-refresh mode. Sharing the status of the self-refresh operation may also improve queue management for the memory controller while maintaining memory reliability through accurate refresh operations.

Example Apparatuses and Systems

FIG. 1 illustrates an example apparatus 100 that can implement aspects of interactive memory self-refresh control to improve system performance and reliability. The described implementations are applicable to memory generally, including those that may comport with an LPDDR memory specification, which may include post-LPDDR5 memory specifications (e.g., LPDDR6 or LPDDR7). The apparatus 100 can be realized, for example, as an internet-of-things (IoTs) device 100-1, a tablet device 100-2, a smartphone 100-3, a notebook computer 100-4, an automobile 100-5, a computing watch 100-6, or a server cluster 100-7. Other apparatus examples include a wearable device, such as smart-glasses or other eyewear; an entertainment device, such as a set-top box, a smart television, or an audio system; a drone or other remotely controlled vehicle; a personal device such as a track pad, drawing pad, netbook, or e-reader; a home security system; a motherboard or server blade; industrial equipment; or a network-attached storage (NAS) device. Note that these electronic devices can be wearable, non-wearable but mobile, or relatively immobile (e.g., desktops or appliances).

In example implementations, the apparatus 100 includes a host device 102, a volatile memory device 104 (memory device 104), and an interconnect 106. The host device 102 may be implemented with any of a variety of different integrated circuit chips, modules or printed circuit boards (PCBs), including a system-on-chip (SoC), an application-specific integrated circuit (ASIC), or an application-specific standard part (ASSP). As shown, the host device 102 also includes a memory controller 108 and a physical interface (PHY) 110. The host device 102 may include other components that are not shown in FIG. 1. For example, the host device 102 may include one or more processors (e.g., a CPU, a GPU, or another core processor), one or more memories (e.g., a cache memory or a buffer memory), or one or more communication systems (e.g., interconnects, memory channels, or input/output (I/O) hardware or firmware).

The memory controller 108 may be realized with any of a variety of suitable memory controllers (e.g., a DDR memory controller that can process requests for data stored on the memory device 104). The physical interface 110 may be realized as any of a variety of suitable physical interfaces that can transfer data between the memory controller 108 and the memory device 104 using the interconnect 106. For example, the physical interface 110 may be an interface that is compatible with a DDR PHY Interface (DFI) Group interface protocol. The memory controller 108 and the physical interface 110 may be coupled, directly or indirectly, to each other. The memory controller 108 and the physical interface 110 may also be coupled, directly or indirectly, to one or more other components included in, or associated with, the host device 102.

The interconnect 106 may be implemented with any of a variety of interconnects that communicatively couple together various components and enable data to be transferred between or among the various components. The interconnect 106 may include a bus, a switching fabric, one or more wires or traces that carry voltage or current signals, and so forth. In the example apparatus 100, the interconnect 106 may be separated into at least a command-and-address (CA) bus 112 and a data (DQ) bus 114 (e.g., for CA and DQ pins, respectively, on the memory device 104). In some implementations, the interconnect 106 may also include a chip-select (CS) I/O (not shown) that can be coupled to, for example, one or more CS pins on the memory device 104. In some implementations, the interconnect 106 may be realized as a combination of any two or more of the examples described herein. Further, the electrical paths or couplings realizing the interconnect 106 can be shared between two or more memory components (e.g., dies, banks, bank groups, and so forth). In some implementations, the CA bus 112 is used only for transmitting addresses and commands (or other control information) from the memory controller 108 to the memory device 104. The DQ bus 114, however, can propagate data between the memory controller 108 and the memory device 104.

The host device 102 may also include control circuitry 116 that is coupled to the host device 102 (e.g., through the memory controller 108). Thus, the memory controller 108 can include the control circuitry 116. The control circuitry 116 can transmit commands to the memory device 104, including a command that causes the memory device 104 to exit a self-refresh mode (e.g., an SRX command). When the command is transmitted, the control circuitry 116 may cause the host device 102, or the memory controller 108, to cease normal operations with the memory device 104 (e.g., to stop transmitting data read/write requests or other memory requests). The control circuitry 116 can also receive or access a signal (e.g., from the memory device 104) that indicates an operational status of the memory device 104. The signal may be based on a determination of the operational status by the memory device 104 or another entity that is associated with the memory device 104. The operational status can include various information, including an indication of whether the memory device 104 is currently performing or undergoing a self-refresh operation (e.g., a self-refresh operational status). For example, the memory device 104 can determine that a self-refresh operation (e.g., an all-bank self-refresh (ABR) operation or another self-refresh operation, such as a per-bank self-refresh (PBR) operation) is being performed. The memory device 104 may make the determination of whether the self-refresh operation is currently being performed in response to receiving the command to exit the self-refresh mode.

For example, the signal can indicate that the memory device 104 is not performing the self-refresh operation (e.g., a no-self-refresh-operation signal). Accordingly, the memory device 104 can begin normal operation or enter a normal operation mode in which the memory device 104 can at least receive commands or instructions to activate memory arrays/rows and receive data read/write requests. In response to receiving the no-self-refresh-operation signal, the control circuitry 116 can cause the host device 102, including the memory controller 108, to resume or begin normal operations with the memory device 104. In some implementations, the host device 102 can begin or resume normal operations when the no-self-refresh-operation signal is received (e.g., as soon as the memory controller 108 is able after receiving the signal). In other implementations, the host device 102 can begin or resume normal operations at the end of a predefined duration starting from when the host device 102 transmitted the command. Thus, in some implementations, the host device 102 may resume or begin normal operations responsive to the no-self-refresh-operation signal being received and after the predefined duration ends. In other implementations, normal operations may begin or resume when the no-self-refresh-operation signal is received.

The predefined duration can account for internal computation, operations, and/or determination times (e.g., to determine the self-refresh status), signaling latency, or other delays. The predefined duration may be any suitable amount of time, including for example, less than approximately 400 nanoseconds (ns), less than approximately 300 ns, less than approximately 100 ns, between approximately between 7.5 ns and approximately 100 ns, less than approximately 7.5 ns, less than approximately 10 ns, or between approximately 4 ns and approximately 12 ns.

In another example, the signal can indicate that the memory device 104 is performing or undergoing a self-refresh operation (e.g., a self-refresh-operation-in-progress signal) and cannot receive data read/write requests and some commands from the host device 102 (e.g., cannot begin normal operation or enter the normal operation mode). In this case, in response to receiving the signal, the control circuitry 116 can cause the host device 102, including the memory controller 108, to begin or continue to refrain from normal operations with the memory device 104 (e.g., to begin or continue to cease transmission of data read/write requests and other commands). When the control circuitry 116 receives another signal that indicates that the self-refresh operation has ended (e.g., a no-self-refresh-operation signal), the control circuitry 116 can cause the host device 102 to resume normal operations with the memory device 104 (e.g., resume transmitting data and other requests). The host device 102 may begin normal operations when the no-self-refresh-operation signal is received or when a timing buffer ends. The timing buffer may have a same or similar length as the predefined duration or a shorter length (e.g., between approximately 5 ns and approximately 10 ns). The length of the timing buffer may be defined and controlled by the host device 102, the memory controller 108 or the control circuitry 116 thereof, the memory device 104, or any combination thereof.

In some implementations, the memory device 104 may assert the signal to indicate that the self-refresh operation is currently being performed, and the memory device 104 may de-assert the signal to indicate that the self-refresh operation has ended (or is not currently being performed when a command, such as a self-refresh exit command is received). Thus, the signal can be asserted and de-asserted to indicate the self-refresh operational status of the memory device 104. For example, the control circuitry 116 may receive the signal by detecting a voltage level (e.g., a first voltage level or a second voltage level) on one or more pins of the memory device that are coupled to the host device 102 via the interconnect 106. In this implementation, the asserted signal can provide the "self-refresh-operation-in-progress" signal, which can have a higher voltage level. The de-asserted signal can then provide the "no-self-refresh-operation" signal, which can have a lower voltage level on the same pin or pins as the asserted signal.

In some cases, therefore, the "no-self-refresh-operation" signal may correspond to an absence of an affirmative or active "self-refresh-operation-in-progress" signal. The host device 102 (e.g., through the control circuitry 116) can then refrain from transmitting memory requests to the memory device 104 when the signal is asserted (e.g., when the higher voltage level is detected). Likewise, the host device 102 can begin or resume transmitting memory requests to the memory device when the signal is de-asserted (e.g., when the control circuitry 116 determines that the signal has been de-asserted by detecting the lower voltage level). As in the examples above, the host device 102 can begin or resume normal operations with the memory device 104 after the signal is de-asserted or when the signal is de-asserted and after the predefined duration from the host device 102 transmitting the command ends. In some implementations, the signal or an associated signal may also include other information (e.g., how much time remains in an ongoing self-refresh operation). Further, while some of these examples describe devices and techniques in terms of all-bank self-refresh operations, the concepts apply to other self-refresh operations as well, including at least per-bank self-refresh operations.

The memory device 104 may be realized with any suitable memory and/or storage facility including, but not limited to, Dynamic Random-Access Memory (DRAM), Synchronous DRAM (SDRAM), three-dimensional (3D) stacked DRAM, Double Data Rate (DDR) memory, or Low-Power DDR (LPDDR) memory. The memory device 104 may be configured with at least one memory card or stick, at least one memory module (e.g., a single in-line memory module (SIMM) or dual in-line memory module (DIMM)), at least one memory die, at least one memory array, at least one memory bank, combinations thereof, and so forth.

The memory device 104 may include control circuitry 118 that is coupled to data cells of the memory device 104 (e.g., coupled to the at least one memory array, the at least one memory bank, the at least one memory die, and so forth). The control circuitry 118 can receive commands (e.g., from the host device 102), including a command that causes the memory device 104 to exit a self-refresh mode (e.g., the SRX command). The control circuitry 118 can also determine an operational status of the memory device 104. For example, to determine the operational status, the control circuitry 118 can determine whether the memory device 104 is currently performing or undergoing a self-refresh operation, such as an ABR operation, a PBR operation, or another self-refresh operation. The determination of the operational status may be responsive to the control circuitry 118 receiving the command (e.g., the SRX command). In some implementations, the operational status can be determined within a predefined duration of receiving the command. For example, the predefined duration may be the predefined duration described above that can account for internal computation and/or determination times (e.g., to determine the self-refresh status), signaling latency, or other delays. Additionally, the operational status can include other information, including an indication of how much time remains in an ongoing self-refresh operation.

The control circuitry 118 can also transmit a signal to another device, including the host device 102, to indicate the determined operational status. The memory device 104 can transmit the signal using, for example, an output data bus (e.g., one or more output DQ pins, a data mask inversion (DMI) pin, or a dedicated pin that does not exist or has a different purpose in existing memory standards). Depending on the configuration the memory device 104 uses to transmit the signal, the host device 102 may include a corresponding mechanism to receive the signal from the memory device 104.

For example, in response to a determination that the memory device 104 is not performing the self-refresh operation, the control circuitry 118 can transmit the no-self-refresh-operation signal described above. In example implementations, the memory device 104 may be ready to begin normal operation or enter the normal operation mode when the command is received from the host device 102, when the determination that the memory device 104 is not performing the self-refresh operation is complete, when the no-self-refresh-operation signal is transmitted, or when the predefined duration from the transmission of the command ends. Transmitting the no-self-refresh-operation signal to the host device can cause the host device 102 to begin or resume transmitting memory requests to the memory device.

In another example, the control circuitry 118 can determine that the memory device 104 is performing the self-refresh operation. In response, the control circuitry 118 can transmit the self-refresh-operation-in-progress signal described above, indicating that the memory device 104 is not ready to begin or resume normal operation or enter the normal operation mode. Transmitting the self-refresh-operation-in-progress signal can cause the host device 102 to refrain from transmitting memory requests to the memory device. In this case, when the control circuitry 118 determines that the self-refresh operation has ended, the control circuitry 118 can stop transmitting the self-refresh-operation-in-progress signal and transmit a no-self-refresh-operation signal that indicates that the self-refresh operation has ended and that the memory device 104 can begin or resume normal operation (e.g., resume receiving data requests). As described above, the memory device 104 may send the no-self-refresh-operation signal and begin normal operations when the determination is complete or when the buffering timer ends. Transmitting the self-refresh-operation-in-progress signal to the host device 102 can cause the host device 102 to stop (or not begin) transmitting memory requests to the memory device.

In some implementations, the memory device 104 may assert the signal to indicate that the self-refresh operation is currently being performed, and de-assert the signal to indicate that the memory device 104 has ceased performing the self-refresh operation or is not currently performing the self-refresh operation (e.g., the "transmission" of the signal can include the asserting, the de-asserting, or both). Thus, the signal can be asserted and de-asserted using one or more pins of the memory device 104 (e.g., the one or more output DQ pins, the data mask inversion (DMI) pin, or the dedicated pin) to indicate the operational status of the memory device 104. For example, the control circuitry 118 may assert the signal by causing a voltage level to be high on the pin or pins that are being used to transmit the signal. Similarly, the control circuitry 118 may de-assert the signal by causing the voltage level to be low on the same pin or pins. In this implementation, the "self-refresh-operation-in-progress" signal may be the higher voltage level and the "no-self-refresh-operation" signal may be the lower voltage level on the same pin or pins.

In some cases, therefore, the "no-self-refresh-operation" signal may correspond to an absence of an affirmative or active condition of the "self-refresh-operation-in-progress" signal. The host device 102 (e.g., through the control circuitry 116) can then refrain from transmitting memory requests to the memory device 104 when the memory device 104 asserts the signal (e.g., when the memory device 104 causes voltage level to be the higher level) and can begin or resume transmitting memory requests when the memory device 104 de-asserts the signal (e.g., when the memory device 104 causes the voltage level to be the lower level). As in the examples above, the host device 102 can begin or resume normal operations with the memory device 104 after the signal is de-asserted or when the signal is de-asserted and after the predefined duration ends. In some implementations, the signal or an associated signal may also include other information (e.g., how much time remains in an ongoing self-refresh operation).

Figure 2:
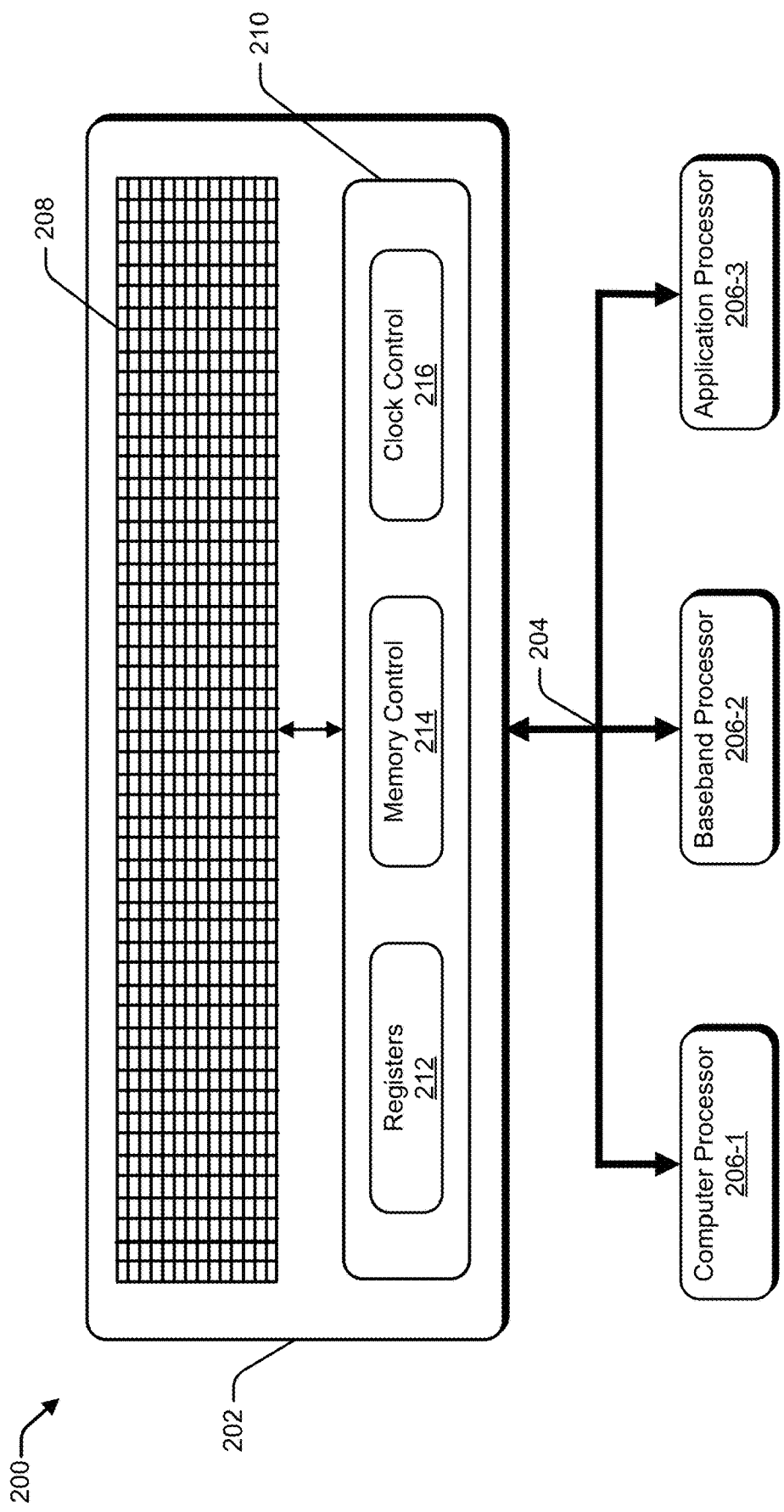
FIG. 2 illustrates an example computing system that can implement aspects of interactive memory self-refresh control.

FIG. 2 illustrates an example computing system 200 that can implement aspects of interactive memory self-refresh control. In some implementations, the computing system 200 includes a memory device 202, an interconnect 204, and at least one processor 206. The memory device 202 can include, or be associated with, at least one memory array 208 and control circuitry 210 that is communicatively coupled to the memory array 208. The memory array 208 can include an array of memory cells, including but not limited to memory cells of Dynamic Random-Access Memory (DRAM), Synchronous DRAM (SDRAM), three-dimensional (3D) stacked DRAM, Double Data Rate (DDR) memory, or Low-Power DDR (LPDDR). The memory array 208 and the control circuitry 210 may be components on a single semiconductor die or on separate semiconductor dies.

The control circuitry 210 can include any of a number of components that can be used by the memory device 202 to perform various operations (e.g., communicate with other devices, manage performance, and so forth). For example, the control circuitry 210 can include one or more registers 212, a memory control component 214, and a clock control component 216. The registers 212 may be implemented, for example, as one or more registers that can be used to store information that can be used by the control circuitry 210 or another part of the memory device 202. The memory control component 214 may be implemented as circuitry that can provide command decoding, address decoding, input/output functions, amplification circuitry, power supply, power control, and other functions. The clock control component 216 may be implemented as circuitry that can provide synchronization of various components of the memory device 202 with one or more external clock signals that may be provided over the interconnect 204, such as a command/address clock (e.g., CK_t or CK_c) or a data clock (e.g., WCK_t or WCK_c), and/or for the internal generation of clock signals.

As shown in FIG. 2, the registers 212, the memory control component 214, and the clock control component 216 are part of a single component (e.g., the control circuitry 210). In other implementations, one or more of the registers 212, the memory control component 214, or the clock control component 216 may be implemented as separate components, which can be provided on a single semiconductor die or across multiple semiconductor dies.

The interconnect 204 may be implemented with any of a variety of interconnects that communicatively couple together various components and enable commands, addresses, and/or other information and data to be transferred between or among the various components (e.g., between the memory device 202 and the one or more processors 206). For example, the interconnect 204 may be realized as the interconnect 106 described with reference to FIG. 1 or implemented in a manner similar to the interconnect 106. While the interconnect 204 is shown with a single arrow in FIG. 2, the interconnect 204 may include a bus, a switching fabric, one or more wires or traces that carry voltage or current signals. Further, the interconnect 204 may be separated into at least a command-and-address (CA) bus and a data bus.

As shown in FIG. 2, the one or more processors 206 may include a computer processor 206-1, a baseband processor 206-2, and an application processor 206-3, which are coupled to the memory device 202 through the interconnect 204. The processors 206 may each be a CPU, GPU, SoC, ASIC, FPGA, or the like. In some cases, a single processor comprises multiple processing resources, each dedicated to different functions, such as modem management, applications, graphics, central processing, or the like. In some implementations, the baseband processor 206-2 may include or be coupled to a modem (not shown in FIG. 2) and may be referred to as a modem processor. The modem and/or the baseband processor 206-2 may be coupled wirelessly to a network via, for example, cellular, WiFi®, Bluetooth®, near field, or another technology or protocol for wireless communication. In some implementations, the processors 206 may be connected directly to the memory device 202. In other implementations, one or more of the processors may be indirectly connected to the memory device 202 (e.g., over a network connection or through one or more other devices).

In some implementations, the control circuitry 210 may also provide additional memory features, such as determining an operational status (or a self-refresh operational status) of the memory device 202 and providing the operational status to one or more other devices, such as to the processors 206 (e.g., the control circuitry 210 may provide services similar to or the same as those provided by the control circuitry 118 as described with reference to FIG. 1). The operational status may be provided to the other device or devices over any of a number of communication channels, including the interconnect 204 or a data bus (e.g., via one or more output DQ pins, at least one data mask inversion (DMI) pin, or at least one dedicated pin). In some implementations, these features may be enabled in response to a command received from the one or more processors 206 over the interconnect 204, including a command that causes the memory device 202 to exit a self-refresh mode (e.g., the SRX command). In other implementations, these features can be enabled in response to an externally applied signal voltage, clock signal, or other signal or in response to the memory device 202 detecting a change in an operating mode (e.g., a beginning or ending of an operating mode, such as a self-refresh mode), a register setting, or an environmental condition.

Communicating a status of the self-refresh operation of the memory device 202 can improve system performance, including data rate and latency, by reducing the amount of time that read and write requests (e.g., from the processors 206) are paused while self-refresh operations are performed or while such operations merely may be being performed. This communication may also improve queue management for the requesting device (e.g., a memory controller or the processors 206), while maintaining memory reliability through accurate refresh operations.

Example Operating Schemes

Figure 3:
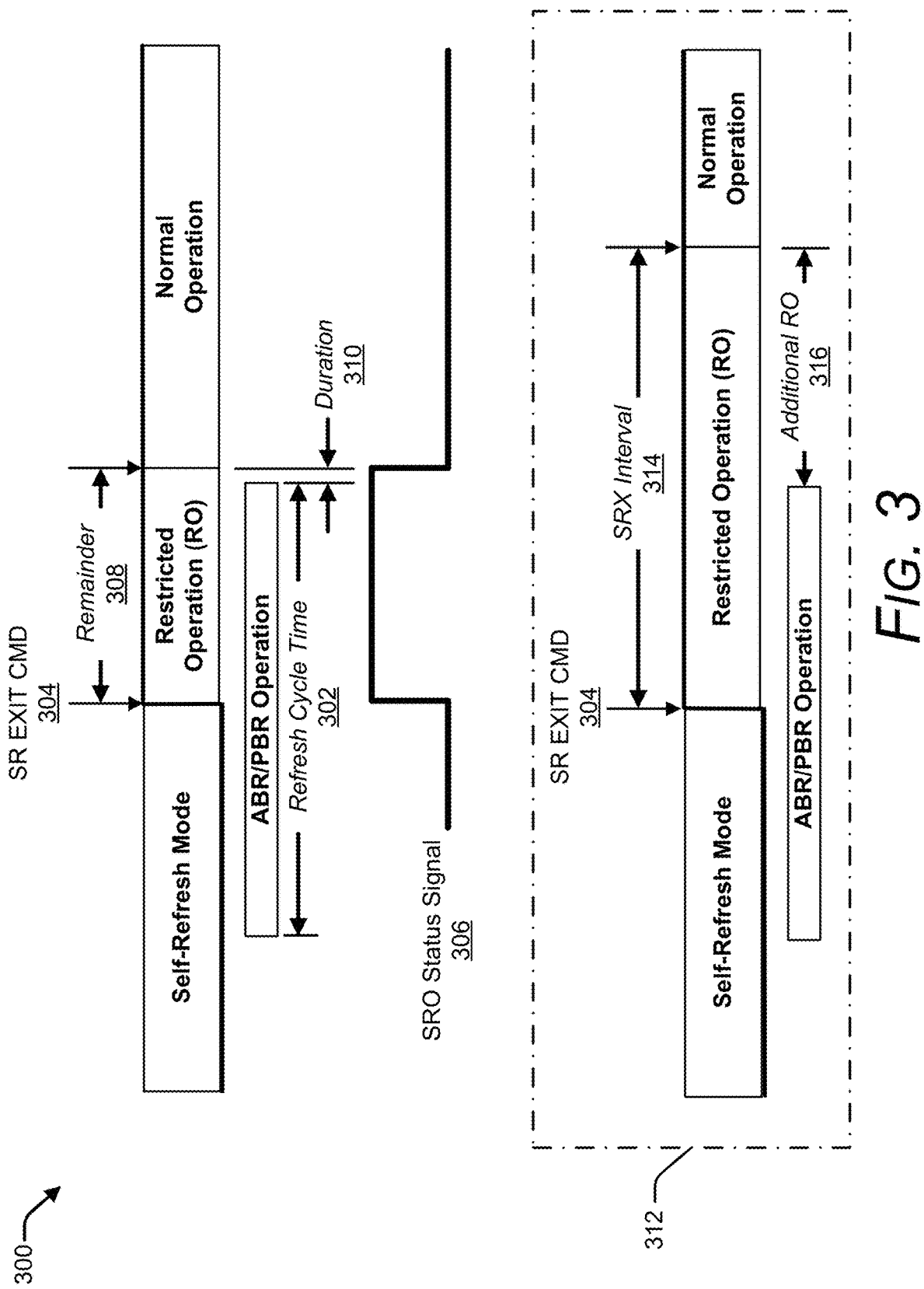
FIG. 3 illustrates an example operating diagram that depicts aspects of how interactive memory self-refresh control can be implemented.

FIG. 3 illustrates an example operating diagram 300 that depicts aspects of how interactive memory self-refresh control can be implemented with a host device or a memory device. The details of the example operating diagram 300 are described with reference to the host device 102 and the memory device 104, but the details are applicable to other apparatuses, DRAM memory systems, and devices, including the memory device 202 described with reference to FIG. 2. The example operating diagram 300 begins, in the upper half of FIG. 3, with the memory device 104 in a self-refresh mode. In the self-refresh mode, the memory device 104 may perform all-bank self-refresh (ABR) operations or per-bank self-refresh (PBR) operations based on an internal timer or counter (e.g., a self-refresh timer that is internal to the memory device 104). A refresh cycle time 302 for performing the ABR/PBR operation (e.g., tRFCab or tRFCpb) can take up to 500 nanoseconds (ns). For example, depending on memory density, the refresh cycle can take between approximately 200 ns and approximately 500 ns. There may also be an additional amount of time to account for computations, latencies, and other delays (e.g., approximately four to approximately ten additional nanoseconds). During the ABR/PBR operations, the memory device 104 cannot perform some functions, including responding to activation commands and data read/write requests (e.g., restricted operation (RO), as shown in FIG. 3).

Continuing with the illustrated example, the memory device 104 then receives a command 304 to exit the self-refresh mode (SR EXIT CMD 304), which can correspond to the SRX command. Upon receiving the SR EXIT CMD 304, the memory device 104 can determine an operational status (e.g., whether the memory device 104 is currently performing or undergoing an ABR or a PBR operation). In the example depicted in FIG. 3, the memory device 104 determines that the ABR/PBR operation is being performed. In response to the determination, the memory device 104 can transmit a self-refresh operational status signal (SRO status signal) 306 to the host device 102 (e.g., the self-refreshoperation-in-progress signal described with reference to FIG. 1). The SRO status signal 306 indicates that the memory device is performing the ABR/PBR operation and cannot process data read/write requests, even though the host device has transmitted the self-refresh exit command and the self-refresh mode may have ended.

In some implementations, the SRO status signal 306 may be realized using a signal with multiple voltage levels, such as a first voltage level and a second voltage level. These multiple voltage levels can include, for example, a low or a high voltage level that toggles when the memory device determines whether the ABR/PBR operation is being performed (e.g., in a binary computing or encoding environment). For example, the voltage level can be low when the memory device is not performing the ABR/PBR operation, and high when the memory device is performing the ABR/PBR operation, or vice versa). In some implementations, as shown in FIG. 3, the memory device 104 can transmit the SRO status signal 306 substantially when the SR EXIT CMD 304 is received. In other implementations (not shown), the memory device 104 may consume a wait time to complete the status determination prior to transmitting the SRO status signal 306.

The memory device 104 continues restricted operation for a remainder 308 of the refresh cycle time 302. The remainder 308 may be a same or similar length as the refresh cycle time 302 (e.g., when the ABR/PBR operation begins at or near when the SR EXIT CMD 304 is received) or shorter than the refresh cycle time 302 (e.g., when the ABR/PBR operation is nearly complete when the SR EXIT CMD 304 is received). During the remainder 308, the memory device 104 monitors the operational status and, when the ABR/PBR operation ends, stops transmitting the SRO status signal 306 (including at least ceasing transmission of a given value of the signal) to indicate that the ABR/PBR operation has ended and the memory device 104 can enter a normal operation mode (e.g., receive and process commands and data read/write requests). In some implementations, rather than ceasing to transmit the SRO status signal 306, the memory device 104 transmits a different signal (e.g., the no-self-refresh-operation signal described with reference to FIG. 1).

Additionally, in some implementations, when the ABR/PBR operation ends, the memory device 104 may wait another time duration 310 before ceasing to transmit the SRO status signal 306 (or before starting to transmit the no-self-refresh-operation signal) to account for internal operations and other latencies. The duration 310 may be any suitable time (e.g., between approximately 5 ns and approximately 10 ns) and may be defined and controlled by the memory device 104, the host device 102, or both.

The example operating diagram 300 depicts aspects of an example of how interactive memory self-refresh control can be implemented for a memory device and a host device (or for a memory device and one or more other devices). The advantages of these techniques can be demonstrated via an example comparison diagram 312, which illustrates another memory device that does not implement interactive memory self-refresh control (e.g., but that may otherwise be similar to the memory device 104). In the example comparison diagram 312, some elements of the example operating diagram 300 are omitted or altered for clarity. As shown in the example comparison diagram 312, when a host device issues the SR EXIT CMD 304 (at a same or similar time as in the operating diagram 300), the other memory device does not determine the self-refresh operational status and does not transmit the SRO status signal 306. Consequently, because the host device does not have access to the self-refresh operational status, the other memory device continues restricted operation for a self-refresh exit (SRX) interval 314.

The SRX interval 314 may be a same or similar length as the refresh cycle time 302, as described, including the additional time to account for operations, latencies, and other delays. In some implementations, the SRX interval 314 may have, for example, a duration of tRFCab plus 7.5 ns or tRFCpb plus 7.5 ns. Thus, as shown in the example comparison diagram 312, the other memory device continues in restricted operation for an additional restricted operation time (additional RO) 316 that is avoided when using interactive memory self-refresh control in the same timespan for the memory device 104, as shown in the upper portion of FIG. 3 at operating diagram 300. The additional RO 316 can be a same or similar time as the SRX interval 314, depending on when the ABR/PBR operation begins, relative to when the SR EXIT CMD 304 is received. Thus, the restricted operation period can be much shorter by using interactive memory self-refresh control, delays in accessing the memory can be reduced, and memory performance can be increased.

Figure 4:
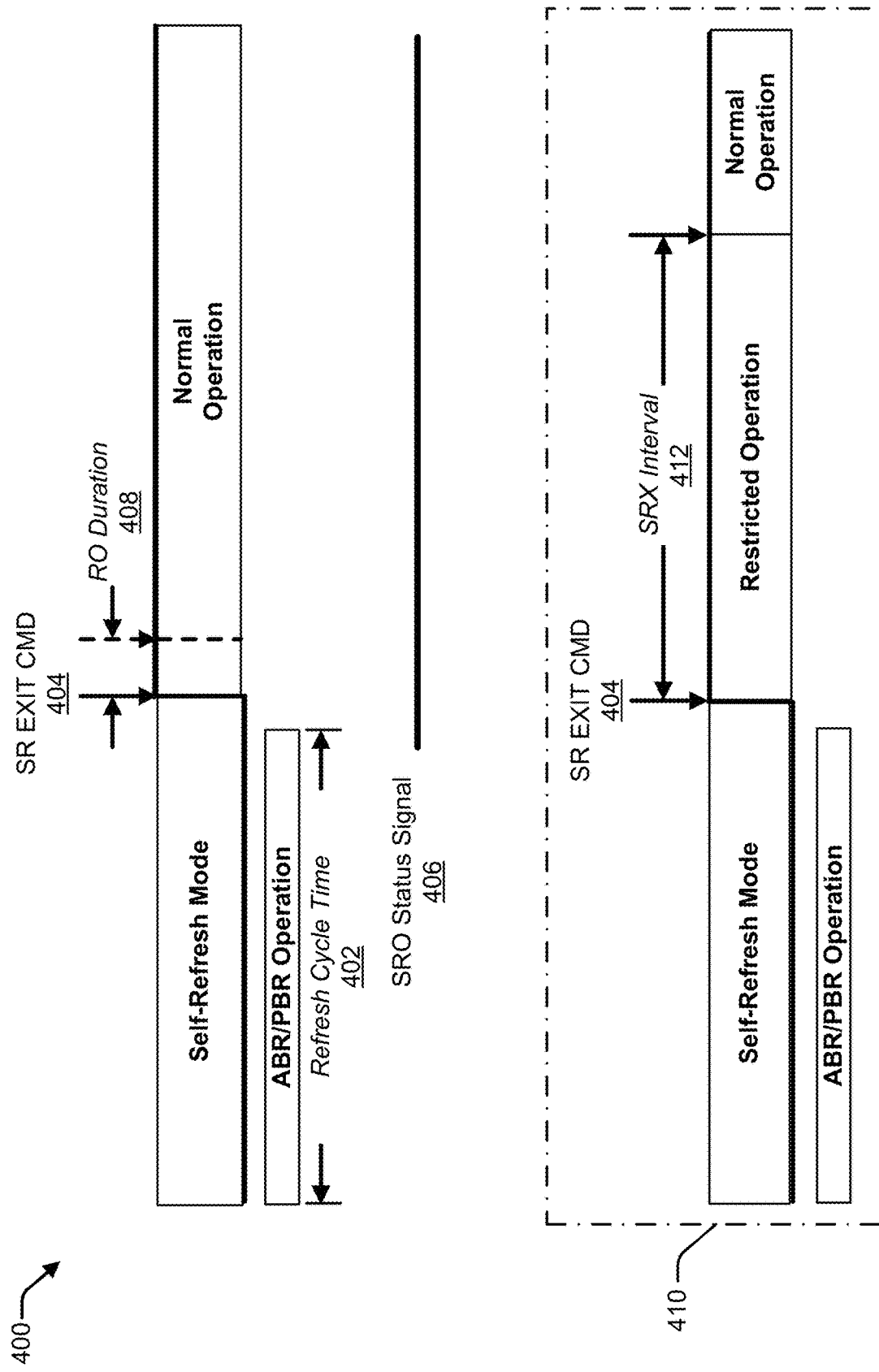
FIG. 4 illustrates another example operating diagram that depicts additional aspects of how interactive memory self-refresh control can be implemented.

FIG. 4 illustrates another example operating diagram 400 that depicts additional aspects of how interactive memory self-refresh control can be implemented with a host device or a memory device. The details of the example operating diagram 400 are again described with reference to the host device 102 and the memory device 104, but the details are applicable to other apparatuses, DRAM memory systems, and devices, including the memory device 202 described with reference to FIG. 2. The example operating diagram 400 begins in the upper half of FIG. 4 with the memory device 104 in a self-refresh mode, as described with reference to FIG. 3 (e.g., a self-refresh mode with a refresh cycle time 402 that is analogous to the refresh cycle time 302 of FIG. 3). Continuing the illustrated example, the memory device 104 receives a command 404 to exit the self-refresh mode (SR EXIT CMD 404), which can be or correspond to the SRX command. Upon receiving the SR EXIT CMD 404, the memory device 104 can determine a self-refresh operational status (e.g., whether the memory device 104 is performing an ABR or a PBR operation).

In the example depicted in FIG. 4, the memory device 104 determines that the ABR/PBR operation is not being performed. In response to the determination, the memory device 104 can transmit a self-refresh operational status signal (SRO status signal) 406 to the host device 102 (e.g., the no-self-refresh-operation signal described with reference to FIG. 1). The SRO status signal 406 indicates that the memory device is not performing the ABR/PBR operation and can process data read/write requests (e.g., enter the normal operation mode, as shown). In some implementations, the SRO status signal 406 may be realized using a signal with multiple voltages, such as a low or a high voltage level that toggles when the memory device 104 determines whether the ABR/PBR operation is being performed (e.g., low for a no-self-refresh-operation signal and high for self-refresh-operation-in-progress signal, or vice versa). Additionally or alternatively, when the memory device 104 determines no ABR/PBR operation is being performed, the memory device 104 may wait or consume another time duration (not shown) before transmitting the SRO status signal 406 to account for internal operations and other latencies, as described with reference to FIG. 3.

The memory device 104 may continue restricted operation for a restricted operation (RO) duration 408 after receiving the SR EXIT CMD 404. The RO duration 408 can be a time period that is sufficient for the memory device 104 to receive the SR EXIT CMD 404, process the SR EXIT CMD 404 (e.g., determining whether a self-refresh operation is in progress), and send a signal to the memory device 102. The RO duration 408 can also be less than a length of the ABR/PBR operation. Thus, the host device 102 may wait for the RO duration 408 to end and, in the absence of an indication that a self-refresh operation is in progress (e.g., the self-refresh-operation-in-progress signal), begin sending commands and data requests.

The example operating diagram 400 depicts aspects of an example of how interactive memory self-refresh control can be implemented for a memory device and a host device (or for a memory device and one or more other devices). The advantages of these techniques can be demonstrated via an example comparison diagram 410, which illustrates another memory device that does not implement interactive memory self-refresh control, but that may otherwise be similar to the memory device 104, for example.

In the example comparison diagram 410, some elements of the example operating diagram 400 are omitted or altered for clarity. As shown in the example comparison diagram 410, when a host device issues the SR EXIT CMD 404 (at a same or similar time as in the operating diagram 400), the other memory device does not determine the self-refresh operational status and does not transmit the SRO status signal 406. Consequently, because the host device does not have access to the self-refresh operational status, the other memory device continues restricted operation for a self-refresh exit (SRX) interval 412 that is avoided when using interactive memory self-refresh control in the same timespan for the memory device 104. The SRX interval 412 may be a same or similar length as the refresh cycle time 402, as described, including the additional time to account for operations, latencies, and other delays (e.g., the SRX interval 412 may have a duration of tRFCab plus 7.5 ns or tRFCpb plus 7.5 ns). The example comparison diagrams 312 and 410 illustrate only some of the advantages of using the described interactive memory self-refresh control techniques and apparatuses, including reducing latency to improve system performance (e.g., by increasing data rate and reducing queue depth for the host device) while maintaining memory reliability with timely and accurate refresh operations.

Figures 1, 5:
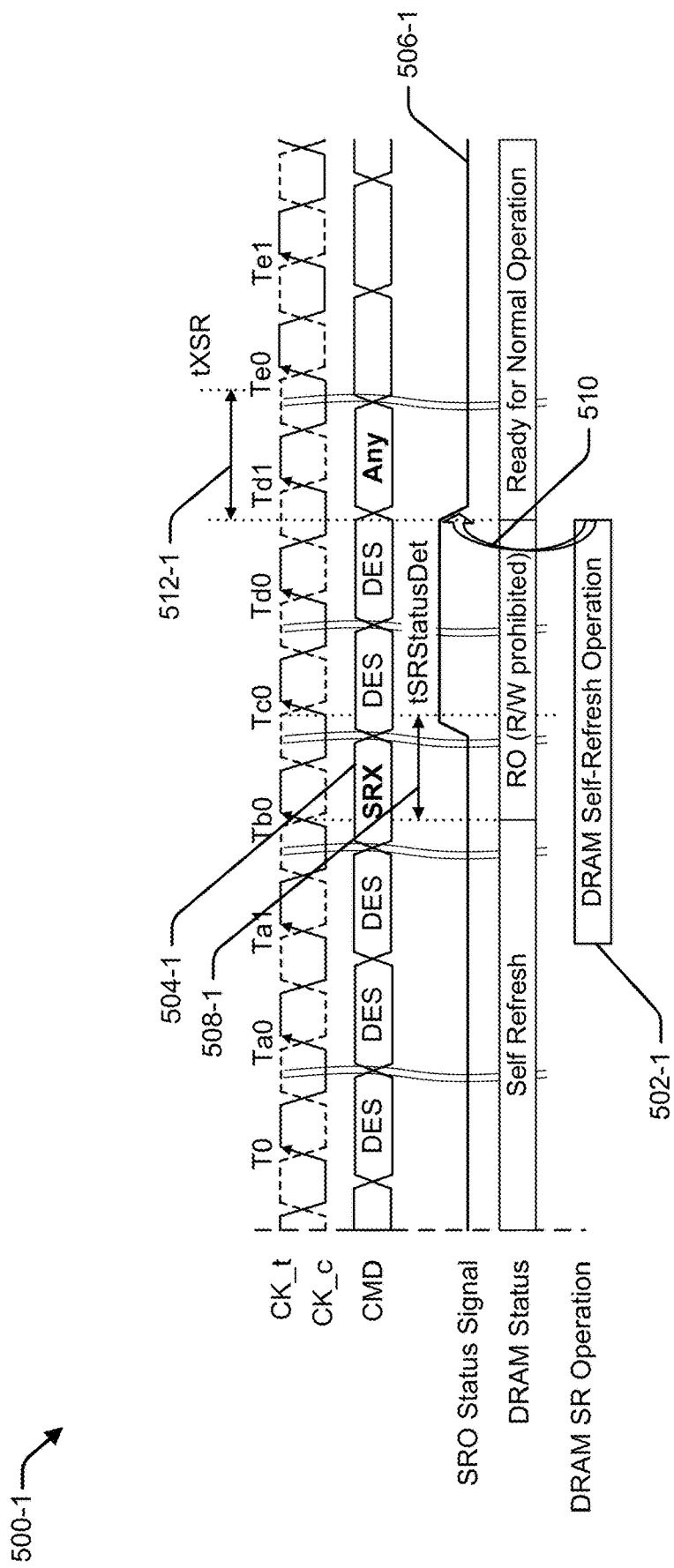
Figures 2, 5:
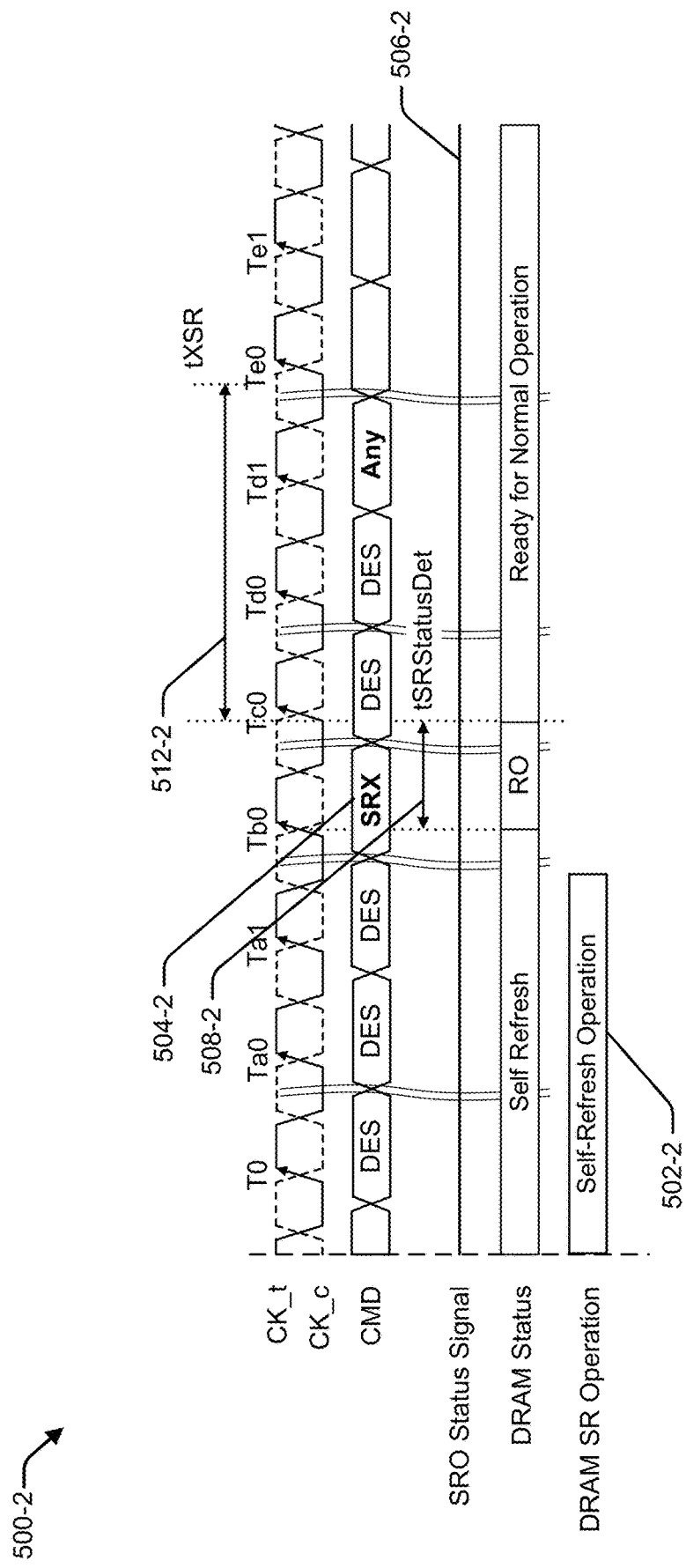

FIG. 5-1 and FIG. 5-2 depict example timing diagrams 500-1 and 500-2, respectively, which illustrate example operations of a host device and a memory device in accordance with example implementations of the described interactive memory self-refresh control techniques and apparatuses. The example timing diagram 500-1 illustrates a case in which the memory device 104 is performing or undergoing a self-refresh operation 502-1 (e.g., the ABR or PBR operation) when the memory device 104 receives the command 504-1 to exit the self-refresh mode (e.g., the SRX command). As shown, the self-refresh status operation signal (SRO status signal) 506-1 is not asserted at T0 (e.g., a voltage level is low on one or more pins or other electronic communication mechanism that the memory device 104 is using to transmit the SRO status signal 506-1).

After the command 504-1 is received, the memory device 104 can enter a restricted operation (RO) mode, during which receiving and processing data read/write requests and some commands is prohibited. After a duration 508-1 (tSRStatusDet, for Self-Refresh Status Detection time), which is a duration to allow the memory device 104 time to determine and indicate the self-refresh status, the SRO status signal 506-1 is asserted (e.g., the voltage level is driven high on the one or more pins or other electronic communication mechanism) to indicate that the memory device 104 is performing the self-refresh operation 502-1. The duration 508-1 may be a same or similar length as the predefined duration described with reference to FIG. 1 or the RO duration 408 of FIG. 4. When the self-refresh operation 502-1 is complete, the memory device 104 de-asserts the SRO status signal 506-1, as shown by a curved arrow 510, and the memory device 104 is ready for normal operation (e.g., enters the normal operation mode).

Another example timing diagram 500-2 illustrates another case, in which the memory device 104 is not performing the self-refresh operation 502-2 (e.g., the ABR or PBR operation) when the memory device 104 receives the command 504-2 to exit the self-refresh mode (e.g., the SRX command). As shown, the self-refresh status operation signal (SRO status signal) 506-2 is again not asserted at T0. After the command 504-2 is received, the memory device 104 can enter the RO mode, during which receiving and processing data read/write requests and some commands is prohibited. After a duration 508-2 (tSRStatusDet), the SRO status signal 506-2 remains de-asserted to indicate that the memory device 104 is not performing the self-refresh operation 502-2. The duration 508-2 may be a same or similar length as the predefined duration described with reference to FIG. 1 or the RO duration 408 of FIG. 4. Because the self-refresh operation 502-2 is complete prior to the memory device 104 receiving the command 504-2, the memory device 104 is ready for normal operation (e.g., enters the normal operation mode) by the time the duration 508-2 ends. Further, the memory controller 108, or the control circuitry 116 thereof, is designed or programmed to be aware of this duration 508-2. The memory controller 108 can therefore begin sending memory requests to the memory device 104 at the conclusion of the duration 508-2 without waiting for a longer period corresponding to a full duration of a self-refresh operation.

Without the described interactive memory self-refresh control techniques and apparatuses, the memory device 104 does not transmit the SRO status signal 506-1 or 506-2. Because the host device (or another device transmitting commands and read/write requests to the memory device) does not have access to the self-refresh operational status in the case without the SRO status signal 506-1 or 506-2, the memory device continues restricted operation for additional time 512-1 or 512-2 until an interval sufficient to account for any in-process self-refresh operations expires (e.g., at tXSR). As can be seen with reference to the example timing diagrams 500-1 and 500-2, substantial time can be saved by using the described interactive memory self-refresh control techniques and apparatuses (e.g., up to approximately 500 nanoseconds at each self-refresh exit).

Example Methods

Figure 6:
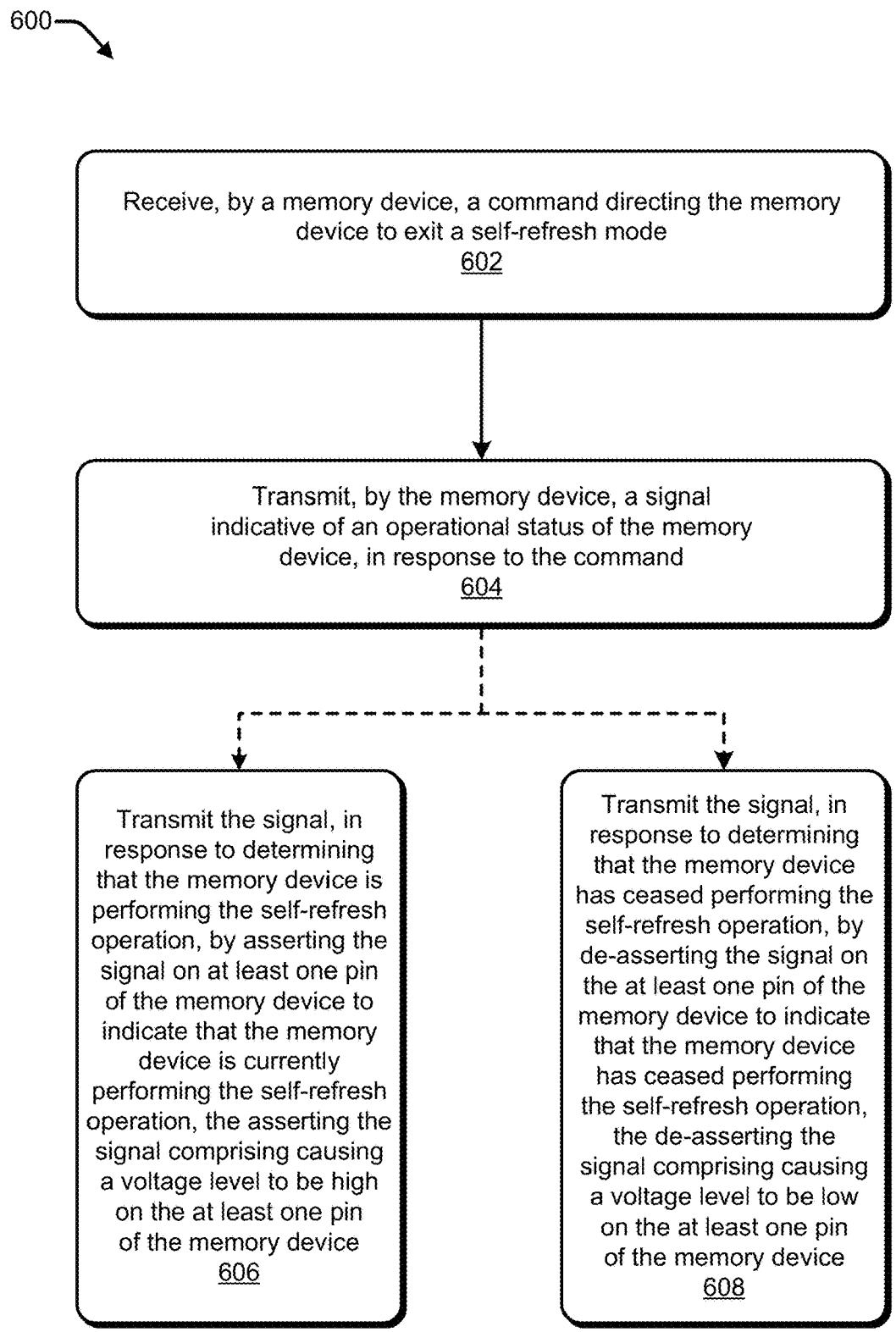
FIG. 6 and FIG. 7 illustrate example methods for a device or an apparatus to implement interactive memory self-refresh control.
Figure 7:
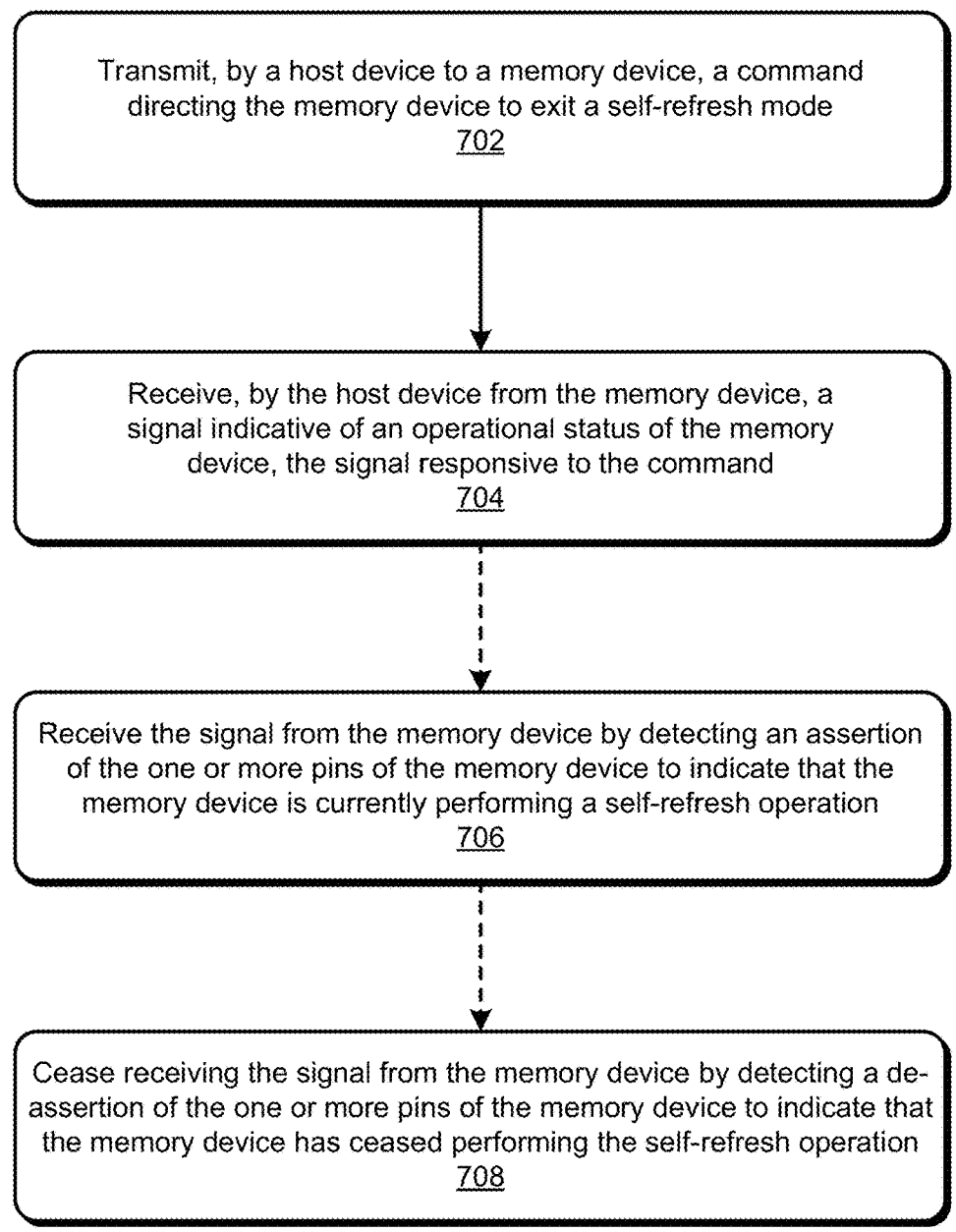

FIG. 6 and FIG. 7 illustrate example methods 600 and 700 for a device or an apparatus to implement interactive memory self-refresh control. The following discussion may reference components or techniques described with reference to one or more of the example apparatus 100, the example computing system 200, the example operating diagrams 300 and/or 400, or the example timing diagrams 500-1 and/or 500-2 described with regard to FIGS. 1 through 5, reference to which is made below only by way of example.

Beginning with the example method 600, at 602, a memory device receives a command from a host device. The command can be a command that directs or causes the memory device to exit a self-refresh mode (e.g., an SRX command). For example, the memory device may be the memory device 104 (or the memory device 202), as described with reference to FIG. 1 (or FIG. 2), and the architecture may include features described with reference to FIG. 1 through FIG. 5.

At 604, the memory device transmits a signal that indicates an operational status of the memory device in response to receiving the command. The operational status can indicate whether the memory device is currently performing or undergoing a self-refresh operation (e.g., a self-refresh operational status). For example, the memory device 104 can determine whether the memory device 104 is performing a self-refresh operation, such as an all-bank refresh (ABR) operation or a per-bank self-refresh (PBR) operation on at least one memory array, and transmit the signal to the host device 102 based at least in part on the determination. In some implementations, the memory device 104 transmits the signal in response to receiving the command.

Optionally, at 606, in response to determining that the memory device is performing the self-refresh operation, the memory device can transmit the signal by asserting the signal on one or more pins of the memory device to indicate that the memory device is currently performing the self-refresh operation (e.g., one or more output DQ pins, a data mask inversion (DMI) pin, or a dedicated pin). For example, the memory device 104 or 202 can transmit the self-refresh-operation-in-progress signal, as described with reference to FIG. 1, to the host device 102 or the processors 206 of FIG. 1 and FIG. 2, respectively. In some implementations, the memory device 104 can assert the signal that indicates that the memory device 104 is currently performing the self-refresh operation by causing a voltage level to be high on the pin or pins that are being used to transmit the signal.

Optionally, at 608, in response to determining that the memory device has ceased performing the self-refresh operation, the memory device can transmit the signal by de-asserting the signal to indicate that the memory device has stopped performing the self-refresh operation. For example, the memory device 104 or 202 can transmit the no-self-refresh-operation signal, as described with reference to FIG. 1, to the host device 102 or the processors 206 of FIG. 1 and FIG. 2, respectively. In some implementations, the memory device 104 can de-assert the signal by causing the voltage level to be low on the pin or pins that are being used to transmit the signal. Asserting the signal can cause the host device to refrain from transmitting memory requests to the memory device, and de-asserting the signal may cause the host device to resume transmitting memory requests.

Continuing with the example method 700, at 702, a host device transmits a command to a memory device. The command can be a command that directs or causes the memory device to exit a self-refresh mode (e.g., an SRX command). For example, the host device may be the host device 102 or the one or more processors 206 as described with reference to FIG. 1 and FIG. 2, respectively. Further, the memory device may be the memory device 104 (or the memory device 202), as described with reference to FIG. 1 (or FIG. 2), and the architecture may include features described with reference to FIG. 1 through FIG. 6.

At 704, the host device receives a signal from the memory device that indicates an operational status of the memory device. The operational status can indicate whether the memory device is currently performing or undergoing a self-refresh operation (e.g., a self-refresh operational status). In some cases, the signal may be transmitted from the memory device in response to the command. For example, the host device 102 (or the one or more processors 206) can receive the signal from the memory device 104 (or the memory device 202). The operational status can include a determination by the memory device 104, in response to the self-refresh exit command, of whether the memory device 104 is currently performing a self-refresh operation. The self-refresh operation may be, for example, an all-bank refresh (ABR) operation or a per-bank self-refresh (PBR) operation.

Optionally, at 706, the host device can receive the signal from the memory device by detecting an assertion of the one or more pins of the memory device to indicate that the memory device is currently performing the self-refresh operation. For example, the host device 102 can detect a high voltage level on the one or more pins being used to transmit the self-refresh-operation-in-progress signal from the memory device 104 or 202 to the host device 102 or the processors 206 of FIG. 1 and FIG. 2, respectively. In some implementations, the host device 102 can refrain from transmitting memory requests to the memory device 104 in response to the signal being asserted.

Optionally, at 708, the host device can cease receiving the signal from the memory device by detecting a de-assertion of the one or more pins of the memory device to indicate that the memory device has ceased performing the self-refresh operation. For example, the host device 102 can detect a low voltage level on the one or more pins being used to transmit the self-refresh-operation-in-progress signal (thereby transforming the signal into a no-self-refresh-operation signal) from the memory device 104 or 202 to the host device 102 or the processors 206 of FIG. 1 and FIG. 2, respectively. In some implementations the host device 102 can begin or resume transmitting memory requests to the memory device 104 in response to the de-asserting of the signal.

For the flow charts and flow diagrams described above, the orders in which operations are shown and/or described are not intended to be construed as a limitation. Any number or combination of the described process operations can be combined or rearranged in any order to implement a given method or an alternative method. Operations may also be omitted from or added to the described methods. Further, described operations can be implemented in fully or partially overlapping manners.

Aspects of these methods may be implemented in, for example, hardware (e.g., fixed-logic circuitry or a processor in conjunction with a memory), firmware, software, or some combination thereof. The methods may be realized using one or more of the techniques, apparatuses, or components shown in FIGS. 1 to 5, the components of which may be further divided, combined, rearranged, and so on. The devices and components of these figures generally represent hardware, such as electronic devices, packaged modules, IC chips, or circuits; firmware or the actions thereof; software; or a combination thereof. With reference to FIGS. 1 to 5, in some cases, a host device 102 (or one or more processors 206) or a memory device 104 or 202 may individually perform the operations of these methods. In other cases, the host device 102, the processors 206, the memory device 104 or 202, or any combination thereof may jointly perform the operations. FIGS. 3-5 illustrate operational details of example implementations of the described techniques. Thus, these figures illustrate some of the many possible systems or apparatuses capable of implementing the described methods. Accordingly, aspects of the methods 600 and 700 may be implemented in, for example, hardware (e.g., fixed-logic circuitry or a processor in conjunction with a memory), firmware, or some combination thereof as described herein.

Several example implementations are described below.

Example 1: A method, comprising: receiving, by a memory device, a command directing the memory device to exit a self-refresh mode; and transmitting, by the memory device, a signal indicative of an operational status of the memory device responsive to the command.

Example 2: The method of example 1, wherein the operational status relates to whether the memory device is currently performing a self-refresh operation.

Example 3: The method of any one of the preceding examples, further comprising: asserting the signal on at least one pin of the memory device to indicate that the memory device is currently performing the self-refresh operation.

Example 4: The method of any one of the preceding examples, wherein the asserting comprises: causing a voltage level to be high on the at least one pin of the memory device.

Example 5: The method of any one of the preceding examples, further comprising: de-asserting the signal on the at least one pin of the memory device to indicate that the memory device has ceased performing the self-refresh operation.

Example 6: The method of any one of the preceding examples, wherein the de-asserting comprises: causing the voltage level to be low on the at least one pin of the memory device.

Example 7: The method of any one of the preceding examples, wherein: the receiving comprises receiving the command from a host device; and the transmitting comprises transmitting the signal to the host device.

Example 8: The method of any one of the preceding examples, further comprising: causing the host device to refrain from transmitting a memory request to the memory device responsive to the asserting of the signal; and enabling the host device to transmit the memory request to the memory device responsive to the de-asserting of the signal.

Example 9: The method of any one of the preceding examples, further comprising: determining whether the memory device is currently performing a self-refresh operation responsive to the receiving of the command, wherein the transmitting is performed based on the determining.

Example 10: The method of any one of the preceding examples, wherein the self-refresh operation comprises an all-bank self-refresh operation or a per-bank self-refresh operation.

Example 11: A memory device, comprising: at least one memory array; and control circuitry coupled to the at least one memory array and configured to: receive a command directing the memory device to exit a self-refresh mode; and transmit a signal indicative of an operational status of the at least one memory array responsive to the command.

Example 12: The memory device of example 11, wherein the operational status of the at least one memory array relates to whether the at least one memory array is currently undergoing a self-refresh operation.

Example 13: The memory device of example 11 or example 12, wherein the control circuitry is configured to: assert the signal on at least one pin of the memory device to indicate that the at least one memory array is currently undergoing a self-refresh operation.

Example 14: The memory device of any one of examples 11-13, wherein the assertion comprises: causing a voltage level to be high on the at least one pin of the memory device.

Example 15: The memory device of any one of examples 11-14, wherein the at least one pin comprises: at least one data pin; at least one data mask inversion pin; or at least one pin dedicated to indicating the operational status of the at least one memory array.

Example 16: The memory device of any one of examples 11-15, wherein the control circuitry is configured to: de-assert the signal on the at least one pin of the memory device to indicate that the at least one memory array has ceased undergoing the self-refresh operation.

Example 17: The memory device of any one of examples 11-16, wherein the de-assertion comprises: causing a voltage level to be low on the at least one pin of the memory device.

Example 18: The memory device of any one of examples 11-17, wherein: the assertion of the signal is effective to cause a host device that is coupled to the memory device to refrain from transmitting a memory request to the memory device; and the de-assertion of the signal is effective to cause the host device to transmit the memory request to the memory device.

Example 19: The memory device of any one of examples 11-18, wherein the control circuitry is configured to: receive the command from a host device; and transmit the signal to the host device.

Example 20: The memory device of any one of examples 11-19, wherein the control circuitry is configured to: determine whether the memory device is currently performing a self-refresh operation and the transmission of the signal is performed based on the determination.

Example 21: A method comprising: transmitting, by a host device to a memory device, a command directing the memory device to exit a self-refresh mode; and receiving, by the host device from the memory device, a signal indicative of an operational status of the memory device, the signal responsive to the command.

Example 22: The method of example 21, wherein the operational status relates to whether the memory device is currently performing a self-refresh operation.

Example 23: The method of example 21 or example 22, further comprising: detecting an assertion of at least one pin by the memory device to indicate that the memory device is currently performing the self-refresh operation.

Example 24: The method of any one of examples 21-23, further comprising: detecting a de-assertion of the at least one pin by the memory device to indicate that the memory device has ceased performing the self-refresh operation.

Example 25: The method of any one of examples 21-24, further comprising: refraining, by the host device, from transmitting a memory request to the memory device responsive to the assertion of the at least one pin; and transmitting, by the host device, the memory request to the memory device responsive to the de-assertion of the at least one pin.

Example 26: A host device, comprising: a physical interface; and a memory controller including control circuitry coupled to the physical interface, the control circuitry configured to: transmit to a memory device a command directing the memory device to exit a self-refresh mode; and receive from the memory device a signal indicative of an operational status of the memory device responsive to the command.

Example 27: The host device of example 26, wherein the operational status relates to whether the memory device is currently performing a self-refresh operation.

Example 28: The host device of example 26 or example 27, wherein the control circuitry is configured to: receive the signal by detecting a first voltage level on at least one pin of the memory device to indicate that the memory device is currently performing the self-refresh operation.

Example 29: The host device of any one of examples 26-28, wherein the control circuitry is configured to: receive the signal by detecting a second voltage level on the at least one pin of the memory device to indicate that the memory device is not currently performing the self-refresh operation.

Example 30: The host device of any one of examples 26-29, wherein the control circuitry is configured to cause the memory controller to: refrain from transmission of a memory request to the memory device responsive to detection of the first voltage level on the at least one pin of the memory device; and transmit the memory request to the memory device responsive to detection of the second voltage level on the at least one pin of the memory device.

Example 31: The host device of any one of examples 26-30, wherein the control circuitry is configured to: cause the memory controller to wait a predefined duration after the transmission of the command to the memory device before transmitting the memory request to the memory device responsive to the detection of the second voltage level on the at least one pin of the memory device.

Example 32: The host device of any one of examples 26-31, wherein the predefined duration comprises: less than approximately 400 nanoseconds (ns), less than approximately 300 ns, less than approximately 100 ns, between approximately between 7.5 ns and approximately 100 ns, less than approximately 7.5 ns, less than approximately 10 ns, or between approximately 4 ns and approximately 12 ns.

Example 33: The host device of any one of examples 26-32, wherein the control circuitry is further configured to: cause the memory controller to refrain from transmission of a memory request to the memory device responsive to the transmission of the command to the memory device.

Example 34: A memory device, comprising: at least one memory array; and control circuitry coupled to the at least one memory array and configured to: receive a command; determine an operational status of the at least one memory array responsive to receiving the command and within a predefined duration of receiving the command; and transmit a signal to indicate the operational status.

Example 35: The memory device of example 34, wherein the operational status relates to whether the at least one memory array is currently undergoing a self-refresh operation.

Example 36: The memory device of example 34 or example 35, wherein the self-refresh operation comprises an all-bank self-refresh operation or a per-bank self-refresh operation.

Example 37: The memory device of any one of examples 34-36, wherein: the signal comprises a no-self-refresh-operation signal that indicates the memory device can enter a normal operation mode by a time the predefined duration ends, responsive to a determination that the at least one memory array is not undergoing the self-refresh operation.

Example 38: The memory device of any one of examples 34-37, wherein: the signal comprises a self-refresh-operation-in-progress signal that indicates the memory device is not ready to enter the normal operation mode, responsive to a determination that the at least one memory array is undergoing the self-refresh operation.

Example 39: The memory device of any one of examples 34-38, wherein the control circuitry is further configured to: determine that the self-refresh operation has ended; cease transmitting the self-refresh-operation-in-progress signal to the host device responsive to a determination that the self-refresh operation has ended; and transmit the no-self-refresh-operation signal to the host device to indicate that the memory device can enter the normal operation mode responsive to the determination that the self-refresh operation has ended.

Example 40: The memory device of any one of examples 34-39, wherein: the reception of the command comprises reception, from a host device, of a command directing the memory device to exit a self-refresh mode; and the transmission of the signal comprises: transmission of a no-self-refresh-operation signal to the host device responsive to a determination that the memory device is not performing a self-refresh operation, the no-self-refresh-operation signal effective to cause the host device to begin transmitting memory requests to the memory device; or transmission of a self-refresh-operation-in-progress signal to the host device responsive to a determination that the memory device is performing the self-refresh operation, the self-refresh-operation-in-progress signal effective to cause the host device to refrain from transmitting memory requests to the memory device.

Example 41: The memory device of any one of examples 34-40, wherein the command causes the memory device to exit a self-refresh mode.

Example 42: The memory device of any one of examples 34-41, wherein the operational status relates to a self-refresh operational status.

Example 43: An apparatus, comprising: a first means for storing data; and a second means for: receiving a command directing the apparatus to exit a power-saving mode; and transmitting a signal indicative of whether the at least one memory array is currently operating in the power-saving mode, responsive to the command, the signal asserted to indicate that the first means is currently operating in the power-saving mode and de-asserted to indicate that the first means has ceased operating in the power-saving mode.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Also, as used herein, a phrase referring to "at least one of" a list of items refers to any combination of those items, including single members. For instance, "at least one of a, b, or c" can cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figures and terms discussed herein may be indicative of one or more items or terms, and thus reference may be made interchangeably to single or plural forms of the items and terms in this written description.

CONCLUSION

Although implementations for interactive memory self-refresh control have been described in language specific to certain features and/or methods, the subject of the appended claims is not necessarily limited to the specific features or methods described. Rather, the specific features and methods are disclosed as example implementations for interactive memory self-refresh control.

What is claimed is:

1. A method, comprising:
receiving, by a memory device, a command directing the memory device to exit a self-refresh mode; and
transmitting, by the memory device responsive to, and at substantially a same time as the receiving of the command, a signal indicative of an operational status of the memory device, the signal indicative of the operational status having:
a first voltage level that indicates a self-refresh operation was in progress when the command directing the memory device to exit the self-refresh mode was received, the first voltage level effective to enable the memory device to enter a normal operation mode after a first time duration; and
a second voltage level, different from the first voltage level, that indicates a self-refresh operation was not in progress when the command directing the memory device to exit the self-refresh mode was received, the second voltage level effective to enable the memory device to enter a normal operation mode after a second time duration, the second time duration shorter than the first time duration.

2. The method of claim 1, further comprising:
asserting the signal on at least one pin of the memory device to indicate that the self-refresh operation was in progress when the command directing the memory device to exit the self-refresh mode was received.

3. The method of claim 2, wherein the asserting comprises:
causing the at least one pin to be at the first voltage level.

4. The method of claim 2, further comprising:
de-asserting the signal on the at least one pin of the memory device to indicate that the memory device has ceased performing the self-refresh operation that was in progress when the command directing the memory device to exit the self-refresh mode was received and that the memory device has entered the normal operation mode.

5. The method of claim 4, wherein the de-asserting comprises:
causing the at least one pin to be at the second voltage level, the second voltage level comprising a voltage level lower than the first voltage level.

6. The method of claim 4, wherein:
the receiving comprises receiving the command from a host device; and
the transmitting comprises transmitting the signal to the host device.

7. The method of claim 6, further comprising:
causing the host device to refrain from transmitting a memory request to the memory device responsive to the asserting of the signal; and
enabling the host device to transmit the memory request to the memory device responsive to the de-asserting of the signal.

8. The method of claim 1, further comprising:
determining, responsive to the command, that:
the memory device is currently performing a self-refresh operation; or
the memory device is not currently performing the self-refresh operation and, wherein the transmitting is performed based on the determining.

9. The method of claim 8, wherein the self-refresh operation comprises an all-bank self-refresh operation or a per-bank self-refresh operation.

10. A memory device, comprising:
at least one memory array; and
control circuitry coupled to the at least one memory array and configured to:
receive a command directing the memory device to exit a self-refresh mode; and
transmit a signal, responsive to, and at substantially a same time as the receiving of the command, indicative of an operational status of the at least one memory array, the signal indicative of the operational status having:
a first voltage level indicating that a self-refresh operation was in progress when the command directing the memory device to exit the self-refresh mode was received, the first voltage level effective to enable the at least one memory array to enter a normal operation mode after a first time duration; and
a second voltage level, different from the first voltage level, indicating that a self-refresh operation was not in progress when the command directing the memory device to exit the self-refresh mode was received, the second voltage level effective to enable the at least one memory array to enter a normal operation mode after a second time duration, the second time duration shorter than the first time duration.

11. The memory device of claim 10, wherein the control circuitry is configured to:
assert the signal on at least one pin of the memory device to indicate that the self-refresh operation was in progress when the command directing the memory device to exit the self-refresh mode was received.

12. The memory device of claim 11, wherein the assertion comprises:
causing the at least one pin to be at the first voltage level.

13. The memory device of claim 11, wherein the at least one pin comprises:
at least one data pin;
at least one data mask inversion pin; or
at least one pin dedicated to indicating the operational status of the at least one memory array.

14. The memory device of claim 11, wherein the control circuitry is configured to:
de-assert the signal on the at least one pin of the memory device to indicate that the at least one memory array has ceased undergoing the self-refresh operation that was in progress when the command directing the memory device to exit the self-refresh mode was received and the memory device has entered the normal operation mode.

15. The memory device of claim 14, wherein the de-assertion comprises:
causing the at least one pin to be at the second voltage level, the second voltage level comprising a voltage level lower than the first voltage level.

16. The memory device of claim 14, wherein:
the assertion of the signal is effective to cause a host device that is coupled to the memory device to refrain from transmitting a memory request to the memory device; and
the de-assertion of the signal is effective to cause the host device to transmit the memory request to the memory device.

17. The memory device of claim 10, wherein the control circuitry is configured to:
receive the command from a host device; and
transmit the signal to the host device.

18. The memory device of claim 10, wherein the control circuitry is configured to:
determine, responsive to the command, that:
the memory device is currently performing a self-refresh operation; or
the memory device is currently not performing the self-refresh operation, and wherein the transmission of the signal is performed based on the determination.

19. A method comprising:
transmitting, by a host device to a memory device, a command directing the memory device to exit a self-refresh mode; and
receiving, by the host device from the memory device, a signal indicative of an operational status of the memory device, the signal transmitted from the memory device responsive to, and at substantially as same time as receiving, the command, the signal indicative of the operational status having:
a first voltage level that indicates a self-refresh operation was in progress at the memory device when the command directing the memory device to exit the self-refresh mode was received, the first voltage level effective to enable the memory device to enter a normal operation mode after a first time duration; and
a second voltage level, different from the first voltage level, that indicates a self-refresh operation was not in progress at the memory device when the command directing the memory device to exit the self-refresh mode was received, the second voltage level effective to enable the memory device to enter a normal operation mode after a second time duration, the second time duration shorter than the first time duration.

20. The method of claim 19, further comprising:
detecting an assertion of at least one pin by the memory device to indicate that the self-refresh operation was in progress when the command directing the memory device to exit the self-refresh mode was received.

21. The method of claim 20, further comprising:
detecting a de-assertion of the at least one pin by the memory device to indicate that the memory device has ceased performing the self-refresh operation and that the memory device has entered the normal operation mode.

22. The method of claim 21, further comprising:
refraining, by the host device, from transmitting a memory request to the memory device responsive to the assertion of the at least one pin; and
transmitting, by the host device, the memory request to the memory device responsive to the de-assertion of the at least one pin.

23. A host device, comprising:
a physical interface; and
a memory controller including control circuitry coupled to the physical interface, the control circuitry configured to:
transmit to a memory device a command directing the memory device to exit a self-refresh mode; and
receive from the memory device a signal indicative of an operational status of the memory device, the signal transmitted from the memory device responsive to, and at substantially a same time as receiving the command, the signal indicative of the operational status having:
a first voltage level that indicates a self-refresh operation was in progress when the command directing the memory device to exit the self-refresh mode was received, the first voltage level effective to enable the memory device to enter a normal operation mode after a first time duration; and
a second voltage level, different from the first voltage level, that indicates a self-refresh operation was not in progress at the memory device when the command directing the memory device to exit the self-refresh mode was received, the second voltage level effective to enable the memory device to enter a normal operation mode after a second time duration, the second time duration shorter than the first time duration.

24. The host device of claim 23, wherein the control circuitry is configured to:
receive the signal by detecting the first voltage level on at least one pin of the memory device to indicate that the memory device is currently performing the self-refresh operation that was in progress when the command directing the memory device to exit the self-refresh mode was received.

25. The host device of claim 24, wherein the control circuitry is configured to:
receive the signal by detecting the second voltage level on the at least one pin of the memory device to indicate that the memory device is not currently performing the self-refresh operation that was in progress when the command directing the memory device to exit the self-refresh mode was received and that the memory device has entered the normal operation mode.

26. The host device of claim 25, wherein the control circuitry is configured to cause the memory controller to:
refrain from transmission of a memory request to the memory device responsive to detection of the first voltage level on the at least one pin of the memory device; and
transmit the memory request to the memory device responsive to detection of the second voltage level on the at least one pin of the memory device.

27. The host device of claim 26, wherein the control circuitry is configured to:
cause the memory controller to wait a predefined duration after the transmission of the command to the memory device before transmitting the memory request to the memory device responsive to the detection of the second voltage level on the at least one pin of the memory device.

28. The host device of claim 27, wherein the predefined duration comprises: less than approximately 400 nanoseconds (ns), less than approximately 300 ns, less than approximately 100 ns, between approximately between 7.5 ns and approximately 100 ns, less than approximately 7.5 ns, less than approximately 10 ns, or between approximately 4 ns and approximately 12 ns.

29. A memory device, comprising:
at least one memory array; and
control circuitry coupled to the at least one memory array and configured to:
receive a command;
determine an operational status of the at least one memory array responsive to receiving the command and within a predefined duration of receiving the command; and
transmit a signal to indicate the operational status, the transmitting at a substantially same time as the reception of the command, and the signal having:
a first voltage level that indicates a self-refresh operation was in progress when the command was received, the first voltage level effective to enable the at least one memory array to enter a normal operation mode after a first time duration; and
a second voltage level, different from the first voltage level, that indicates a self-refresh operation was not in progress when the command was received, the second voltage level effective to enable the at least one memory array to enter a normal operation mode after a second time duration, the second time duration shorter than the first time duration.

30. The memory device of claim 29, wherein the self-refresh operation comprises an all-bank self-refresh operation or a per-bank self-refresh operation.

31. The memory device of claim 29, wherein:
the signal comprises a no-self-refresh-operation signal that indicates the memory device can enter normal operation mode by a time the first duration ends, responsive to a determination that the at least one memory array is not undergoing the self-refresh operation.

32. The memory device of claim 29, wherein:
the signal comprises a self-refresh-operation-in-progress signal that indicates the memory device is not ready to enter the normal operation mode, responsive to a determination that the at least one memory array is undergoing the self-refresh operation.

33. The memory device of claim 32, wherein the control circuitry is further configured to:
determine that the self-refresh operation that was in progress when the command was received has ended;
cease transmitting the self-refresh-operation-in-progress signal to a host device responsive to a determination that the self-refresh operation that was in progress when the command was received has ended; and
transmit the no-self-refresh-operation signal to the host device to indicate that the memory device can enter the normal operation mode responsive to the determination that the self-refresh operation that was in progress when the command was received has ended.

34. The memory device of claim 29, wherein:
the reception of the command comprises reception, from a host device, of a command directing the memory device to exit a self-refresh mode; and
the transmission of the signal comprises:
transmission of a no-self-refresh-operation signal to the host device responsive to a determination that the memory device is not performing the self-refresh operation, the no-self-refresh-operation signal effective to cause the host device to begin transmitting memory requests to the memory device; or
transmission of a self-refresh-operation-in-progress signal to the host device responsive to a determination that the memory device is performing the self-refresh operation, the self-refresh-operation-in-progress signal effective to cause the host device to refrain from transmitting memory requests to the memory device.

35. The memory device of claim 29, wherein the command causes the memory device to exit a self-refresh mode.

36. The memory device of claim 29, wherein the operational status relates to a self-refresh operational status.

* * * * *